United States Patent
Abe et al.

(12) 
(10) Patent No.: US 10,431,943 B2
(45) Date of Patent: Oct. 1, 2019

(54) COAXIAL INSPECTION CONNECTOR

(71) Applicant: Murata Manufacturing Co., Ltd., Kyoto-fu (JP)

(72) Inventors: Manabu Abe, Nagaokakyo (JP); Yukihiro Kitaichi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/219,635

(22) Filed: Dec. 13, 2018

(65) Prior Publication Data

US 2019/0115700 A1    Apr. 18, 2019

Related U.S. Application Data

(63) Continuation of application No. PCT/JP2017/022941, filed on Jun. 22, 2017.

(30) Foreign Application Priority Data

Jun. 27, 2016    (JP) .................................. 2016-126543

(51) Int. Cl.
| | |
|---|---|
| *H01R 9/05* | (2006.01) |
| *H01R 24/40* | (2011.01) |
| *G01R 1/067* | (2006.01) |
| *H01R 13/24* | (2006.01) |
| *H01R 103/00* | (2006.01) |

(52) U.S. Cl.
CPC ............. *H01R 24/40* (2013.01); *G01R 1/067* (2013.01); *H01R 13/24* (2013.01); *H01R 2103/00* (2013.01); *H01R 2201/20* (2013.01)

(58) Field of Classification Search
CPC ........ H01R 24/00; H01R 24/38; H01R 13/24; H01R 2103/00; H01R 2201/20; G01R 1/067

USPC .......................................................... 439/578
See application file for complete search history.

(56) References Cited

FOREIGN PATENT DOCUMENTS

| CN | 105337122 B | 2/2017 |
|---|---|---|
| JP | 2003-123910 A | 4/2003 |

(Continued)

OTHER PUBLICATIONS

An Office Action mailed by Taiwanese Patent Office dated Jan. 23, 2019, which corresponds to Taiwanese Patent Application No. 106119993 and is related to U.S. Appl. No. 16/219,635.

(Continued)

*Primary Examiner* — Khiem M Nguyen

(74) *Attorney, Agent, or Firm* — Studebaker & Brackett PC

(57) ABSTRACT

A coaxial inspection connector comprises an outer conductor including first and second housings having tubular shapes extending in a first direction, and a center conductor including first and second center conductor portions extending in the first direction, with the first conductor portion fixed to the first housing by a first bushing. The first housing supporting the second housing with an end portion of the second housing on one side in the first direction swinging in a second direction perpendicular to the first direction. The second center conductor portion includes a swing portion supported by the first center conductor portion with an end portion of the second center conductor portion on the one side in the first direction swinging in the second direction, and a tip portion including the end portion on the one side in the first direction and movable in the first direction relative to the swing portion.

20 Claims, 9 Drawing Sheets

(56) References Cited

FOREIGN PATENT DOCUMENTS

| JP | 2007-087682 A | 4/2007 |
|----|---------------|--------|
| JP | 2014-123482 A | 7/2014 |

OTHER PUBLICATIONS

International Search Report issued in PCT/JP2017/022941; dated Sep. 26, 2017.
International Preliminary Report on Patentability and Written Opinion issued in PCT/JP2017/022941; dated Jan. 1, 2019.

COAXIAL INSPECTION CONNECTOR

CROSS-REFERENCE TO RELATED APPLICATIONS

This application claims benefit of priority to International Patent Application No. PCT/JP2017/022941, filed Jun. 22, 2017, and to Japanese Patent Application No. 2016-126543, filed Jun. 27, 2016, the entire contents of each are incorporated herein by reference.

BACKGROUND

Technical Field

The present disclosure relates to a coaxial inspection connector, and, in particular, to a coaxial inspection connector to be connected to a coaxial connector.

Background Art

As an existing disclosure related to a coaxial inspection connector, for example, a coaxial inspection connector described in Japanese Unexamined Patent Application Publication No. 2014-123482 is known. FIG. 8 is a sectional view of a coaxial inspection connector 500 described in Japanese Unexamined Patent Application Publication No. 2014-123482. Hereinafter, the up-down direction in FIG. 8 will be simply referred to as the up-down direction, and the left-right direction in FIG. 8 will be simply referred to as the left-right direction. The direction perpendicular to the plane of FIG. 8 will be referred to as the front-back direction.

As illustrated in FIG. 8, the coaxial inspection connector 500 includes a probe body 510, a probe tip 511, an outer conductor barrel 516, and a housing 525. The outer conductor barrel 516 and the housing 525 have tubular shapes extending in the up-down direction. The upper end of the outer conductor barrel 516 is inserted into the housing 525. The upper end of the outer conductor barrel 516 is supported by the housing 525 in such a way that the lower end of the outer conductor barrel 516 can swing in the front-back direction and the left-right direction.

The probe body 510 includes a coil spring 512, a barrel 513, and a tip portion 515, and extends in the outer conductor barrel 516 and the housing 525 in the up-down direction. The barrel 513 has a tubular shape extending in the up-down direction. The coil spring 512 is disposed in the barrel 513. The tip portion 515 is inserted into the barrel 513 from below, and is pushed downward by the coil spring 512. The probe tip 511 extends in the outer conductor barrel 516 in the up-down direction. The upper end of the probe tip 511 is supported by the tip portion 515 in such a way that the lower end of the probe tip 511 can swing in the front-back direction and the left-right direction. With the coaxial inspection connector 500 having the structure described above, the probe tip 511 and the outer conductor barrel 516 can swing in the front-back direction and the left-right direction. Thus, it is possible to easily attach the coaxial inspection connector 500 to a mating receptacle.

SUMMARY

The inventors of the present disclosure found that, with the coaxial inspection connector 500 described in Japanese Unexamined Patent Application Publication No. 2014-123482, it is difficult to prolong the life of the coaxial inspection connector 500. To be more specific, in the coaxial inspection connector 500, the swing centers of the probe tip 511 and the outer conductor barrel 516 are located near the center of the coaxial inspection connector 500 in the up-down direction. Accordingly, the swingable portion of the coaxial inspection connector 500 (that is, the probe tip 511 and the outer conductor barrel 516) is short. Therefore, if the center of the coaxial inspection connector 500 and the center of the mating receptacle are displaced from each other in the front-back direction or the left-right direction, in order to make these centers coincide with each other, the probe tip 511 and the outer conductor barrel 516 each need to become inclined by a large angle with respect to the probe body 510 and the housing 525. As a result, the probe tip 511 slides considerably relative to the tip portion 515, and large friction is likely to be generated between the probe tip 511 and the tip portion 515. Likewise, the outer conductor barrel 516 slides considerably relative to the housing 525, and large friction is likely to be generated between the outer conductor barrel 516 and the housing 525. Therefore, with the coaxial inspection connector 500 described in Japanese Unexamined Patent Application Publication No. 2014-123482, it is difficult to prolong the life of the coaxial inspection connector 500.

Thus, the present disclosure provides a coaxial inspection connector having a prolonged life.

A coaxial inspection connector according to an aspect of the present disclosure is a coaxial inspection connector including an outer conductor, a center conductor, and a first bushing. The outer conductor includes a first housing that has a tubular shape extending in a first direction, and a second housing that has a tubular shape extending from the first housing toward one side in the first direction. The center conductor includes a first center conductor portion that extends in the first housing in the first direction and that is fixed to the first housing by the first bushing, and a second center conductor portion that extends in the second housing in the first direction. The second housing is supported by the first housing in such a way that an end portion of the second housing on the one side in the first direction is capable of swinging in a second direction that is perpendicular to the first direction. The second center conductor portion includes a swing portion at which the second center conductor portion is supported by the first center conductor portion in such a way that an end portion of the second center conductor portion on the one side in the first direction is capable of swinging in the second direction, and a tip portion that includes the end portion of the second center conductor portion on the one side in the first direction and that is capable of moving in the first direction relative to the swing portion.

With the present disclosure, the life of a coaxial inspection connector can be prolonged.

DETAILED DESCRIPTION

Structure of Coaxial Inspection Connector

Figure 1:
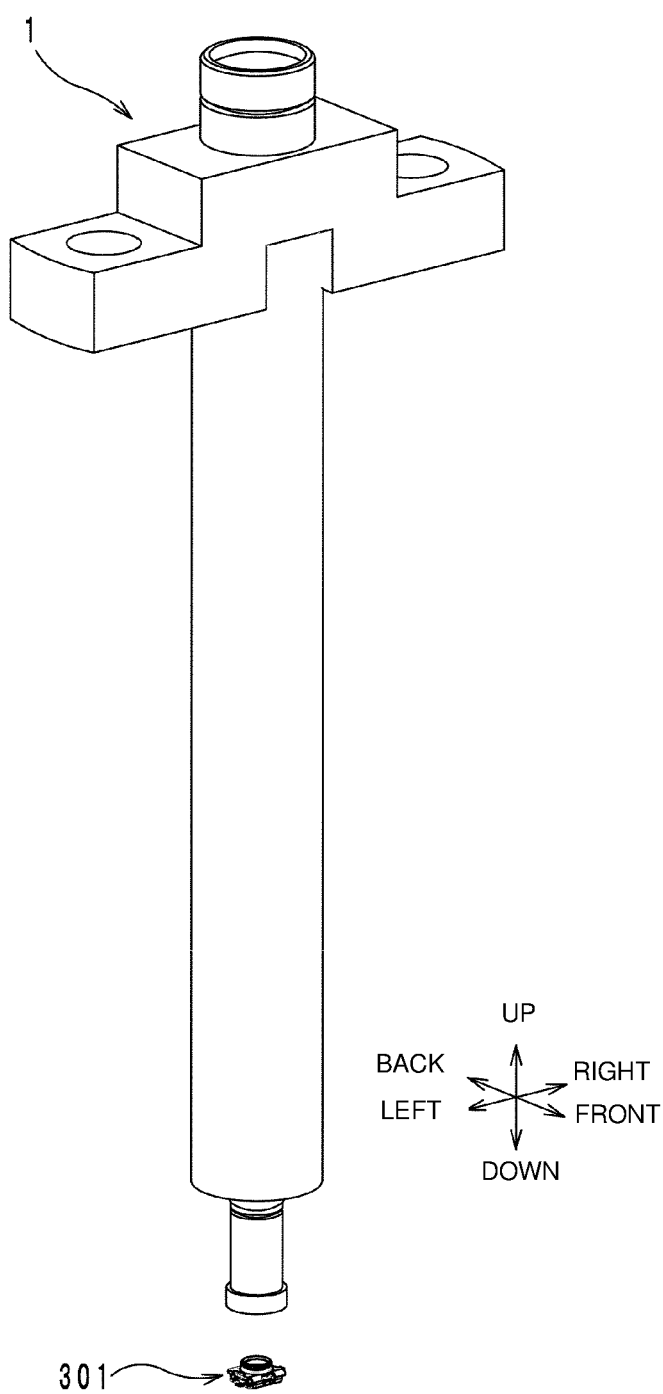
FIG. 1 is an external perspective view of a coaxial inspection connector and a mating receptacle.
Figure 2:
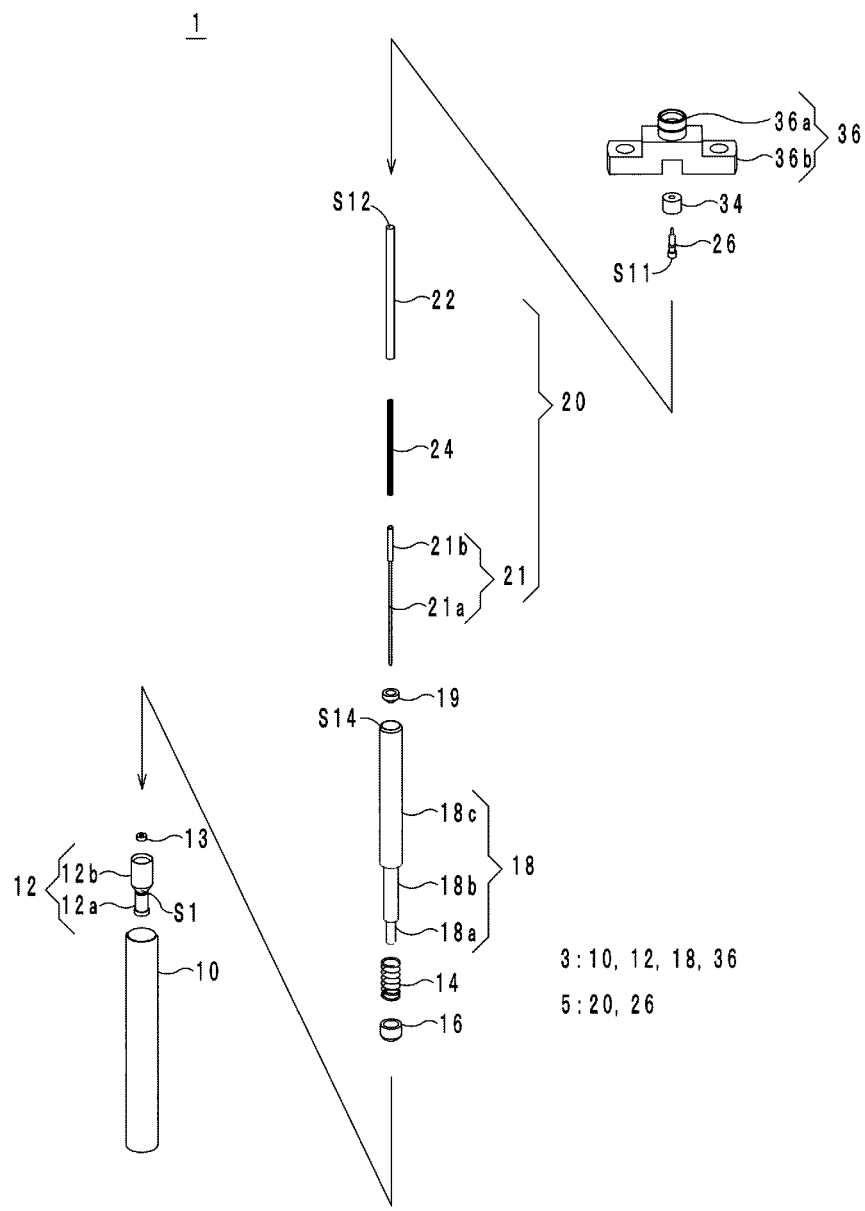
FIG. 2 is an exploded perspective view of the coaxial inspection connector.
Figure 3A:
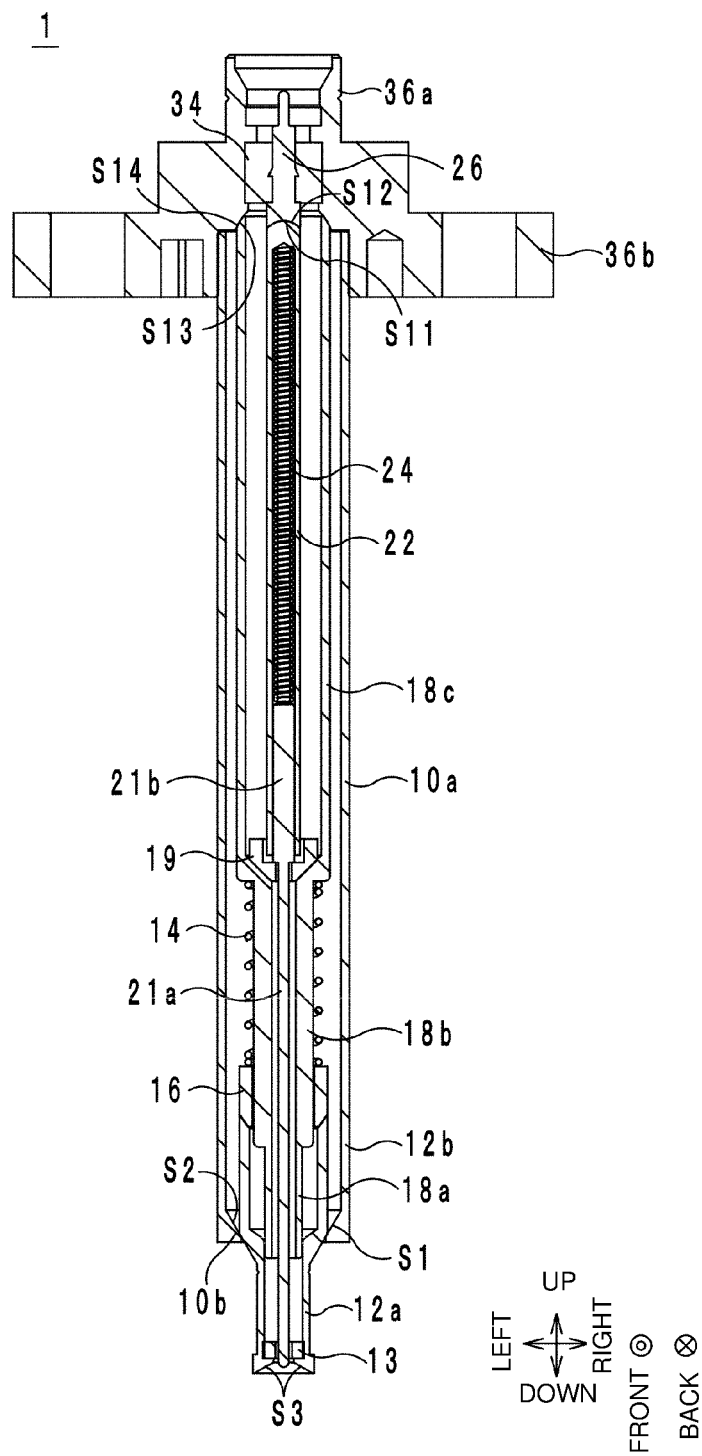
FIG. 3A is a sectional view of the coaxial inspection connector.
Figure 3B:
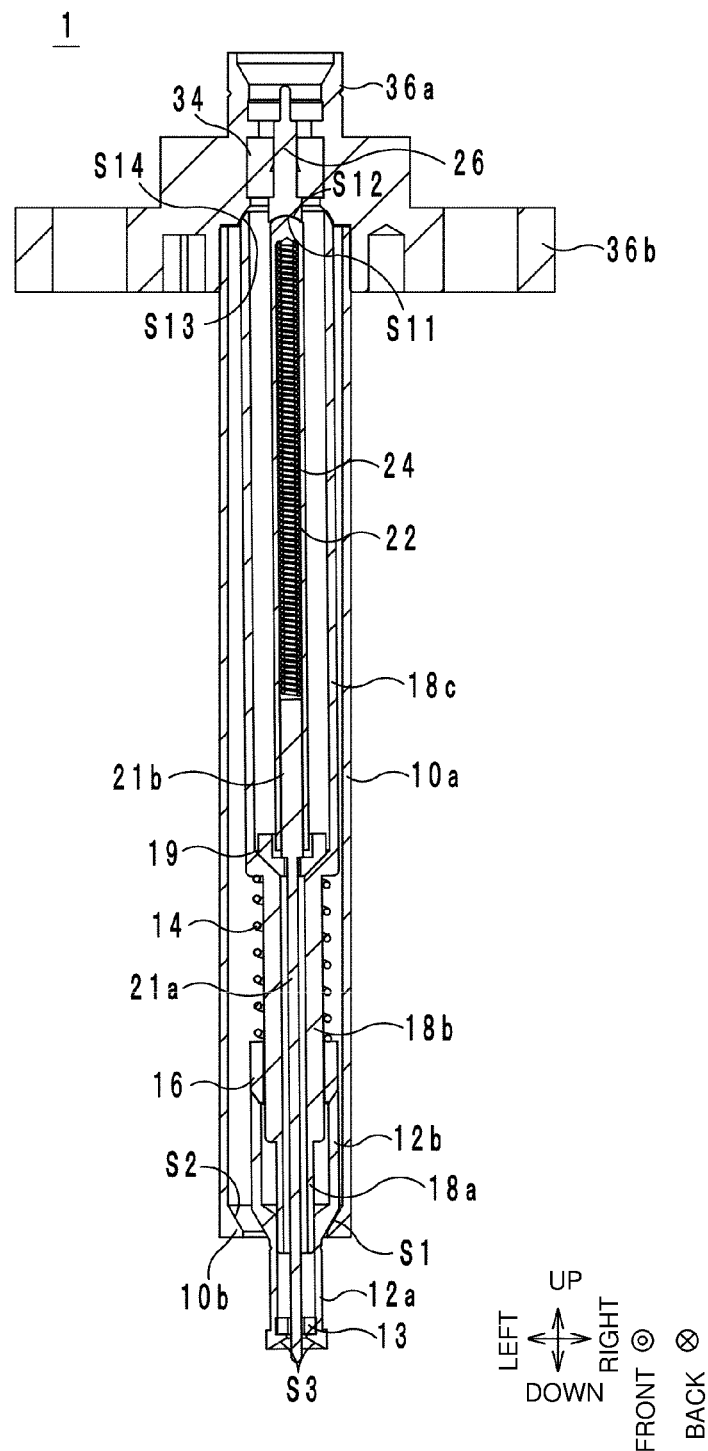
FIG. 3B is a sectional view of the coaxial inspection connector.

Hereinafter, referring to FIGS. 1 to 3B, the structure of a coaxial inspection connector according to an embodiment of the present disclosure will be described. FIG. 1 is an external perspective view of a coaxial inspection connector 1 and a mating receptacle 301. FIG. 2 is an exploded perspective view of the coaxial inspection connector 1. FIGS. 3A and 3B are sectional views of the coaxial inspection connector 1. Hereinafter, the direction in which a center conductor 5 extends is defined as the up-down direction (an example of a first direction, downside is an example of one side in the first direction, and upside is an example of the other side in the first direction). The direction in which a flange 36b of an outer housing 36 of the coaxial inspection connector 1 projects is defined as the left-right direction. The direction that is perpendicular to the up-down direction and the left-right direction is defined as the front-back direction. The up-down direction, the left-right direction, and the front-back direction are perpendicular to each other. Note that the up-down direction, the left-right direction, and the front-back direction defined here are examples and need not coincide with the up-down direction, the left-right direction, and the front-back direction when the coaxial inspection connector 1 is actually used.

As illustrated in FIG. 1, the coaxial inspection connector 1 is configured to be attachable to and removable from the mating receptacle 301 and is used to inspect the mating receptacle 301. As illustrated in FIGS. 1 to 3A, the coaxial inspection connector 1 includes an outer conductor 3, the center conductor 5, a bushing 13, a spring 14, a slide ring 16, and bushings 19 and 34.

The center conductor 5 includes a center conductor portion 20 and a center pin 26. The center pin 26 (an example of a first center conductor portion) is a bar-shaped member extending in the up-down direction. The lower end of the center pin 26 is a surface S11 having a concave spherical shape.

The center conductor portion 20 (an example of a second center conductor portion) is a bar-shaped member extending in the up-down direction. The center conductor portion 20 includes a pin 21, a barrel 22, and a spring 24. The barrel 22 (an example of a swing portion) has a cylindrical shape extending in the up-down direction. The lower end of the barrel 22 is open, and the upper end of the barrel 22 is not open. The upper end of the barrel 22 is a surface S12 having a convex spherical shape. The surface S12 of the barrel 22 and the surface S11 of the center pin 26 are in contact with each other. Thus, the barrel 22 is supported by the center pin 26 in such a way that the lower end of the center conductor portion 20 can swing in the front-back direction and the left-right direction (each of which is an example of a second direction).

The pin 21 (an example of a tip portion) includes the lower end of the center conductor portion 20 and can move in the up-down direction relative to the barrel 22. The pin 21 has a lower portion 21a and an upper portion 21b. The upper portion 21b has a thin elongated columnar shape extending in the up-down direction. The lower portion 21a has a thin elongated columnar shape extending downward from the lower end of the upper portion 21b. The upper portion 21b is shorter than the lower portion 21a. The lower portion 21a is thinner than the upper portion 21b. Hereinafter, the term "thin" or "thick" means that the diameter of a cross section of a member perpendicular to the up-down direction is small or large. The material of the pin 21 and the barrel 22 is, for example, an electroconductive material having a relatively low elasticity (for example, brass).

The upper portion 21b is inserted into the barrel 22 from below. The spring 24 (an example of a second elastic member) is disposed in the barrel 22 and pushes the pin 21 downward relative to the barrel 22. To be more specific, the spring 24 is a compression coil spring that has a center axis extending in the up-down direction. The upper end of the spring 24 is in contact with the upper end of the inner peripheral surface of the barrel 22. The lower end of the spring 24 is in contact with the upper end of the upper portion 21b. When the pin 21 is pushed upward, the spring 24 contracts and thereby pushes the pin 21 downward relative to the barrel 22.

The outer conductor 3 includes a cylinder 10, an outer plunger 12, an inner housing 18, and the outer housing 36, and has a cylindrical shape extending in the up-down direction. As illustrated in FIG. 3A, the cylinder 10 has a body 10a and a projection 10b. The body 10a has a cylindrical shape extending in the up-down direction. The upper end and the lower end of the body 10a are open. The projection 10b is disposed at the lower end of the body 10a and projects inward in the radial direction of the body 10a. The term "radial direction" refers to a direction in which, in a cross section perpendicular to the up-down direction, a line passing through the center of the circular cross section extends. The phrase "inward in the radial direction" refers to a direction toward the center of the circle, and the phrase "outward in the radial direction" refers to a direction opposite to the direction toward the center. The projection 10b has a surface S2 (an example of a first surface) that faces diagonally upward and that is annular. The normal vector of the surface S2 points inward in the radial direction of the cylinder 10 and points upward.

The outer housing 36 (an example of a first housing) includes a body 36a and the flange 36b. The body 36a has a cylindrical shape extending in the up-down direction. The flange 36b is a plate-shaped member extending in the left-right direction from the body 36a. The flange 36b is used to fix the coaxial inspection connector 1 to a base. The upper end of the cylinder 10 is inserted into the outer housing 36 from below. Thus, the cylinder 10 extends downward from the outer housing 36. Moreover, the cylinder 10 is immovably fixed to the outer housing 36. As illustrated in FIG. 3A, in the outer housing 36, a surface S13, which is a part of a concave spherical surface, is formed near the upper end of the cylinder 10. The surface S13 is located at an inner part in the radial direction of the cylinder 10, as seen from below. The material of the cylinder 10 and the outer housing 36 is, for example, SUS (stainless steel).

The inner housing 18 (an example of a second housing) has a cylindrical shape extending in the up-down direction, and includes a lower portion 18a, a middle portion 18b, and an upper portion 18c. The lower portion 18a, the middle portion 18b, and the upper portion 18c have cylindrical shapes extending in the up-down direction. The lower portion 18a is thinner than the middle portion 18b. The middle portion 18b is thinner than the upper portion 18c. The lower portion 18a is connected to the lower end of the middle portion 18b. The middle portion 18b is connected to the lower end of the upper portion 18c.

The upper end of the inner housing 18 is a surface S14, which is a part of a convex spherical surface. The surface S14 of the inner housing 18 and the surface S13 of the outer housing 36 are in contact with each other. Thus, the inner housing 18 extends downward from the outer housing 36. Moreover, the inner housing 18 is supported by the outer housing 36 in such a way that the lower end of the inner housing 18 can swing in the front-back direction and the left-right direction. Moreover, as illustrated in FIG. 3A, the positions of the surfaces S13 and S14 in the up-down direction overlap the positions of the surfaces S11 and S12 in the up-down direction. Thus, the swing center of the inner housing 18 is located near the swing center of the center conductor portion 20. The material of the inner housing 18 is, for example, an electroconductive material having a relatively low elasticity (for example, brass).

The center conductor 5 extends in the outer conductor 3 in the up-down direction. To be more specific, the center pin 26 extends in the outer housing 36 in the up-down direction. The center conductor portion 20 extends in the inner housing 18 in the up-down direction. However, the upper end of the center conductor portion 20 slightly projects upward from the upper end of the inner housing 18. The lower end of the center conductor portion 20 projects downward from the lower end of the inner housing 18.

The bushing 19 (an example of a second bushing) has an annular shape as seen from above, and is an insulator that is made of a resin or the like. The bushing 19 is disposed in the upper portion 18c between the lower end of the upper portion 18c and the lower end of the upper portion 21b. Thus, the center conductor 5 and the inner housing 18 are insulated from each other. Because the center conductor 5 passes through the bushing 19 in the up-down direction, the bushing 19 fixes the positional relationship between the inner housing 18 and the center conductor portion 20 in the front-back direction and the left-right direction. Thus, the inner housing 18 and the center conductor portion 20 can swing together in the cylinder 10 in the front-back direction and the left-right direction.

The bushing 34 (an example of a first bushing) has a cylindrical shape extending in the up-down direction, and is an insulator that is made of a resin or the like. The bushing 34 is disposed in the outer housing 36. The center pin 26 passes through the bushing 34 in the up-down direction. Thus, the bushing 34 fixes the center pin 26 to the outer housing 36. The center conductor 5 and the outer housing 36 are insulated from each other.

The slide ring 16 is an annular member, and is an insulator that is made of a resin or the like. The middle portion 18b of the inner housing 18 passes through the slide ring 16 in the up-down direction. The slide ring 16 can move in the up-down direction relative to the middle portion 18b.

The outer plunger 12 includes a lower portion 12a and an upper portion 12b. The lower portion 12a and the upper portion 12b have cylindrical shapes extending in the up-down direction. The lower portion 12a is thinner than the upper portion 12b. The lower portion 12a is connected to the lower end of the upper portion 12b. Moreover, the lower end of the upper portion 12b has a tapered shape, and the diameter of the lower end of the upper portion 12b decreases from the upper side toward the lower side. That is, the outer plunger 12 has an annular tapered surface that faces diago-nally downward (hereinafter, referred to as a surface S1). The normal vector of the surface S1 (an example of a second surface) points outward in the radial direction of the upper portion 12b and points downward. The lower end of the lower portion 12a has an annular surface S3 that faces diagonally downward. The normal vector of the surface S3 points inward in the radial direction of the lower portion 12a and points downward.

The bushing 13 has an annular shape as seen from above, and is an insulator that is made of a resin or the like. The bushing 13 is disposed in the lower portion 12a. The lower portion 21a passes through the bushing 13 in the up-down direction. Thus, the center conductor portion 20 and the outer plunger 12 are insulated from each other.

The lower portion 18a of the inner housing 18 is inserted into the outer plunger 12 from above. The upper end of the outer plunger 12 is in contact with the lower end of the slide ring 16. Thus, the outer plunger 12 and the slide ring 16 can move together in the up-down direction relative to the lower portion 18a. The material of the outer plunger 12 is, for example, SUS (stainless steel).

The spring 14 (an example of a first elastic member) is disposed between the upper end of the slide ring 16 and the lower end of the upper portion 18c, and pushes the slide ring 16 and the outer plunger 12 downward relative to the inner housing 18. To be more specific, the spring 14 is a compression coil spring having a center axis extending in the up-down direction. The middle portion 18b of the inner housing 18 passes through the spring 14 in the up-down direction. The upper end of the spring 14 is in contact with the lower end of the upper portion 18c. The lower end of the spring 14 is in contact with the upper end of the slide ring 16. When the outer plunger 12 is pushed upward, the spring 14 contracts and thereby pushes the slide ring 16 and the outer plunger 12 downward relative to the upper portion 18c.

Because the outer plunger 12 is pushed downward by the spring 14, the surface S1 is in contact with the surface S2. When the outer plunger 12 does not receive a force from the outside, as illustrated in FIG. 3A, the outer plunger 12 is located in such a way that the center axis of the outer plunger 12 coincides with the center axis of the cylinder 10. When the outer plunger 12 is pushed, for example, rightward and upward, as illustrated in FIG. 3B, the spring 14 contracts, and the center conductor portion 20 rotates counterclockwise around the upper end of the barrel 22, as seen from the front side. Moreover, the outer plunger 12 and the inner housing 18 rotate counterclockwise around the upper end of the inner housing 18, as seen from the front side. Thus, the surface S1 slides along the surface S2 rightward and upward. In the way described above, the pin 21 and the outer plunger 12 can swing in the front-back direction and the left-right direction.

When the force that pushes the outer plunger 12 rightward and upward is released, the spring 14 pushes the outer plunger 12 downward. Thus, the right side portion of the surface S1 is pressed against the right side portion of the surface S2. The normal vector of the surface S1 points outward in the radial direction of the upper portion 12b and points downward. The normal vector of the surface S2 points inward in the radial direction of the cylinder 10 and points upward. In FIG. 3B, at a portion where the surface S1 and the surface S2 are in contact with each other, the surface S1 faces rightward and downward, and the surface S2 faces leftward and upward. Thus, the surface S2 pushes the surface S1 leftward (that is, inward in the radial direction of the cylinder 10). As described above, the outer plunger 12 and the cylinder 10 are configured in such a way that, when the outer plunger 12 contacts the cylinder 10, the cylinder 10 applies to the outer plunger 12 a force toward the inside of the cylinder 10. Thus, the outer plunger 12 moves in such a way that the center axis of the outer plunger 12 coincides with the center axis of the cylinder 10 (self-centering).

(Operation of Coaxial Inspection Connector)

Figure 4:
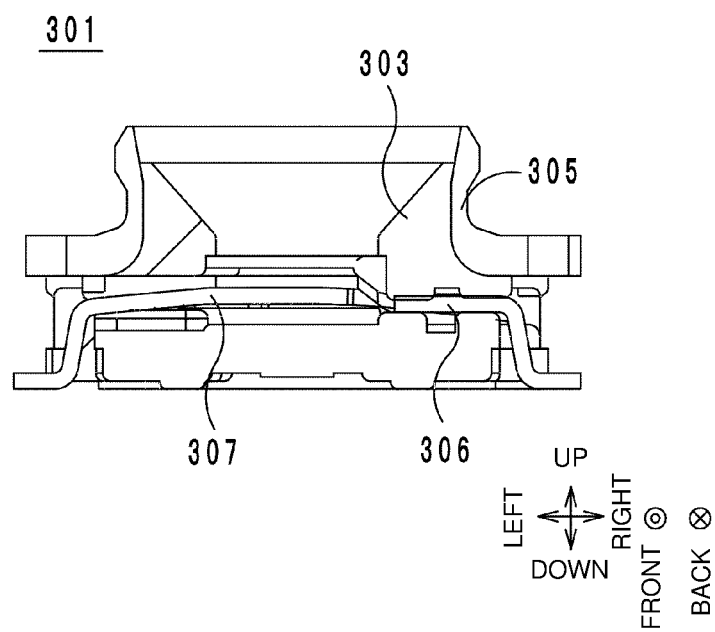
FIG. 4 is a sectional view of the mating receptacle.
Figure 5:
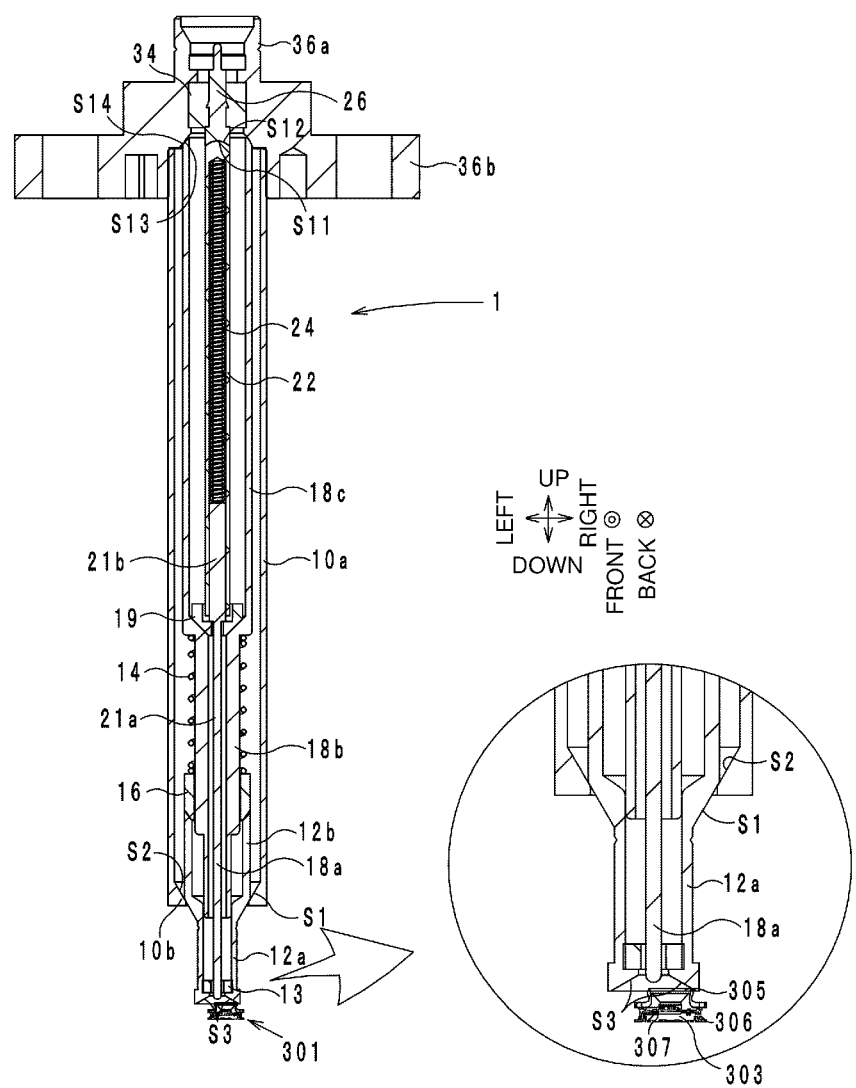
FIG. 5 is a sectional view of the coaxial inspection connector when being attached to the mating receptacle to be inspected.
Figure 6:
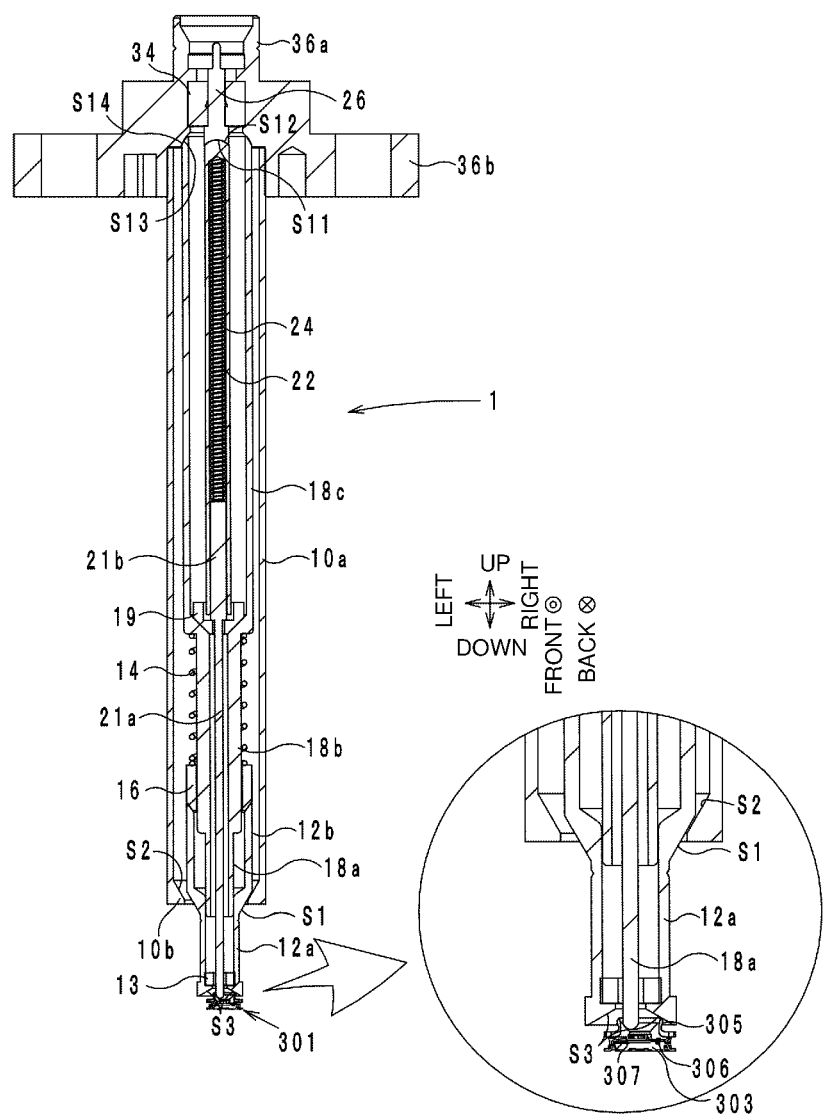
FIG. 6 is a sectional view of the coaxial inspection connector when being attached to the mating receptacle to be inspected.
Figure 7:
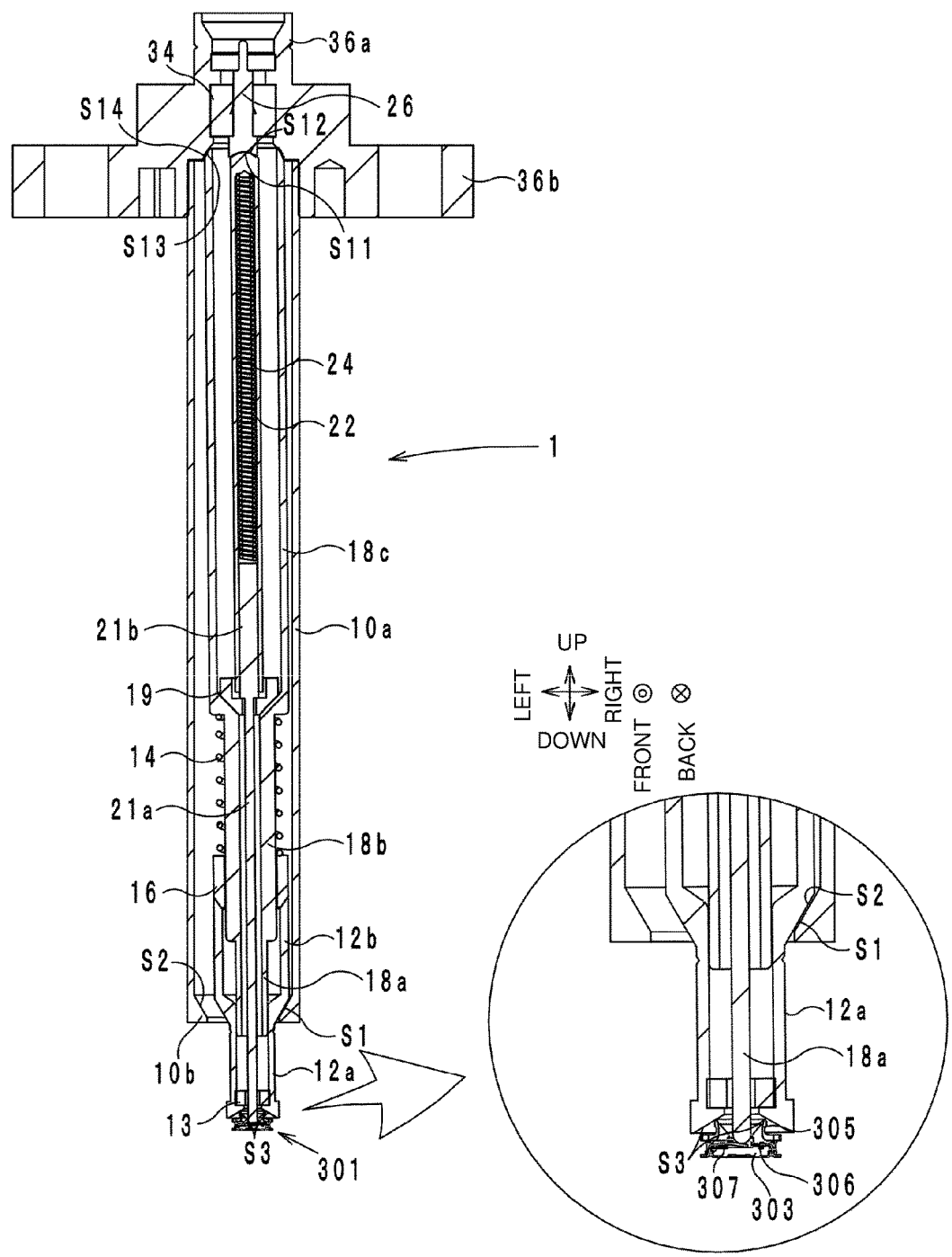
FIG. 7 is a sectional view of the coaxial inspection connector when being attached to the mating receptacle to be inspected.
Figure 8:
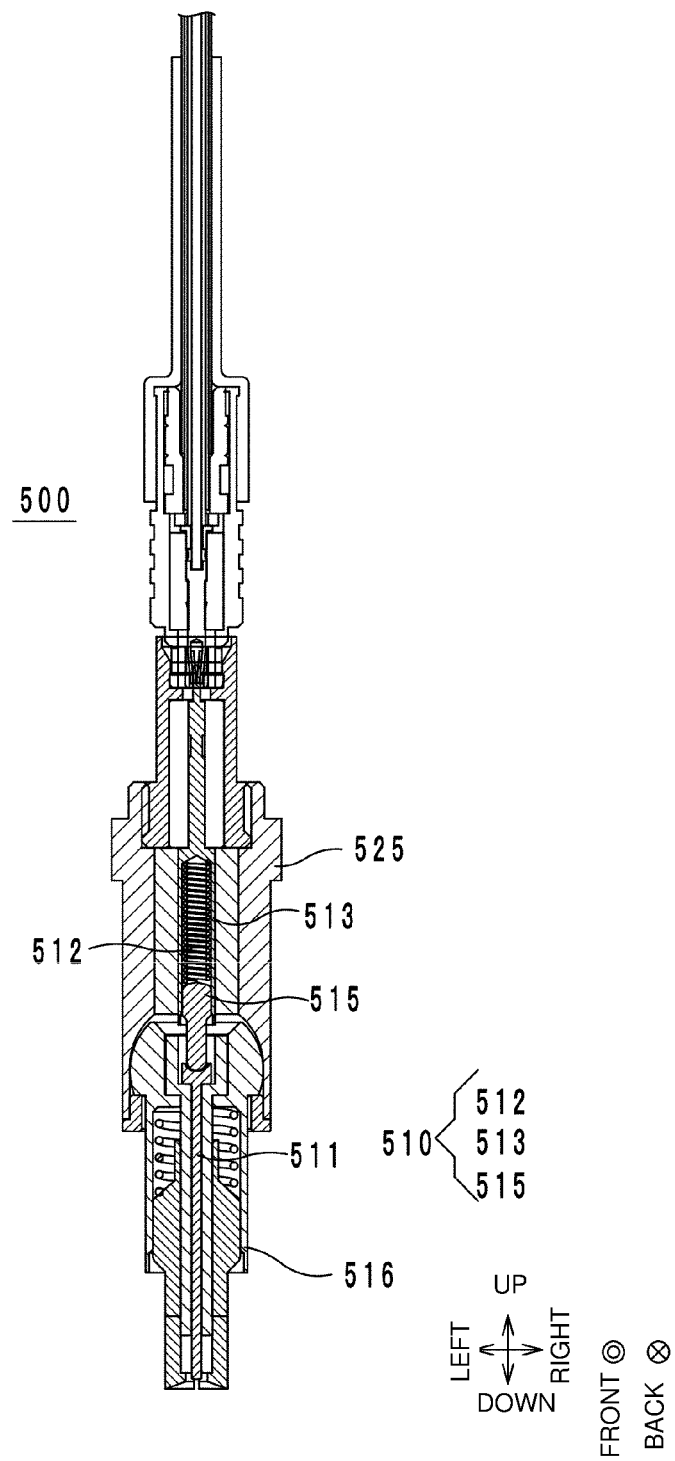
FIG. 8 is a sectional view of a coaxial inspection connector described in Japanese Unexamined Patent Application Publication No. 2014-123482.

Next, an operation of the coaxial inspection connector 1 will be described with reference to the drawings. FIG. 4 is a sectional view of the mating receptacle 301. FIGS. 5 to 7 are sectional views of the coaxial inspection connector 1 when being attached to the mating receptacle 301 to be inspected.

The mating receptacle 301 will be described. The mating receptacle 301 is, for example, a coaxial connector with a switch, which is provided between an antenna and a transmitter-receiver circuit of a cellular phone. The mating receptacle 301 includes a case 303, an outer conductor 305, a fixed terminal 306, and a movable terminal 307. The fixed terminal 306 is connected to the antenna, and the movable terminal 307 is connected to the transmitter-receiver circuit. The case 303 fixes the outer conductor 305, the fixed terminal 306, and the movable terminal 307. In a state in which the coaxial inspection connector 1 is not attached, the movable terminal 307 is in contact with the fixed terminal 306 from below. Thus, the antenna and the transmitter-receiver circuit are electrically connected to each other.

The coaxial inspection connector 1 is connected to a measuring instrument. To be more specific, the center pin 26 is connected to the center conductor of a coaxial cable connected to the measuring instrument, and the outer housing 36 is connected to the outer conductor of the coaxial cable connected to the measuring instrument.

In a state in which the coaxial inspection connector 1 is not attached to the mating receptacle 301, the lower end of the pin 21 is placed within the outer plunger 12 as illustrated in FIG. 3A. That is, when the outer plunger 12 and the pin 21 are not pushed upward, the lower end of the outer plunger 12 is located above the lower end of the pin 21. When the coaxial inspection connector 1 is lowered in this state, the surface S3 of the outer plunger 12 and the upper end of the outer conductor 305 contact each other as illustrated in FIG. 5. In FIG. 5, the center of the outer conductor 305 is displaced rightward relative to the center of the outer plunger 12. In this case, the upper end of the outer conductor 305 contacts a right side portion of the surface S3. The normal vector of the surface S3 points inward in the radial direction of the lower portion 12a and points downward. Thus, at a portion where the outer conductor 305 is in contact, the normal vector of the surface S3 points leftward and downward. As a result, the surface S3 is pushed by the outer conductor 305 rightward and upward.

In FIG. 5, the pin 21 is not in contact with the movable terminal 307. Thus, in the mating receptacle 301, the fixed terminal 306 and the movable terminal 307 are in contact with each other, and the antenna and the transmitter-receiver circuit are connected to each other.

When the coaxial inspection connector 1 is further lowered, the outer plunger 12 is pushed upward by the outer conductor 305, and the spring 14 contracts. Because the outer plunger 12 is pushed rightward, as illustrated in FIG. 6, the surface S1 moves rightward and upward along the surface S2. That is, the outer plunger 12 and the inner housing 18 rotate counterclockwise around the upper end of the inner housing 18, as seen from the front side. Because the outer plunger 12 moves upward, the lower end of the pin 21 protrudes downward from the outer plunger 12. The lower end of the pin 21 contacts the case 303, and is pushed by the case 303 rightward and upward. Thus, as seen from the front side, the center conductor portion 20 rotates, together with the outer plunger 12 and the inner housing 18, counterclockwise around the upper end of the center conductor portion 20.

As illustrated in FIG. 7, when the coaxial inspection connector 1 is further lowered, the center of the outer conductor 305 coincides with the center of the outer plunger 12. Then, the pin 21 pushes the movable terminal 307 downward, and separates the movable terminal 307 from the fixed terminal 306. Thus, the pin 21 and the movable terminal 307 are connected to each other, and the transmitter-receiver circuit and the measuring instrument are connected to each other. Moreover, the outer plunger 12 and the outer conductor 305 are connected to each other.

With the coaxial inspection connector 1, when connecting the coaxial inspection connector 1 to the mating receptacle 301, even if the positions thereof are displaced from each other in the front-back direction and the left-right direction, the coaxial inspection connector 1 and the mating receptacle 301 can be smoothly connected to each other. To be more specific, in the coaxial inspection connector 1, the lower end of the center conductor portion 20 and the lower end of the inner housing 18 can swing in the front-back direction and the left-right direction. Thus, even if the positions of the coaxial inspection connector 1 and the mating receptacle 301 are displaced from each other in the front-back direction and the left-right direction, the lower end of the outer plunger 12 and the lower end of the pin 21 swing and contact the outer conductor 305 and the movable terminal 307 of the mating receptacle 301.

With the coaxial inspection connector 1, the life of the coaxial inspection connector 1 can be prolonged. To be more specific, the coaxial inspection connector 1 includes the center conductor portion 20, the barrel 22, and the pin 21. At the barrel 22, the center conductor portion 20 is supported by the center pin 26 in such a way that the lower end of the center conductor portion 20 can swing in the front-back direction and the left-right direction. The pin 21 includes the lower end of the center conductor portion 20, and can move in the up-down direction relative to the barrel 22. Thus, the swing center of the center conductor portion 20 is located above a mechanism for moving the pin 21 in the up-down direction. Thus, the length of the center conductor portion 20 is long. Therefore, even if the inclination angle of the center conductor portion 20 with respect to the up-down direction is small, it is possible to displace the lower end of the center conductor portion 20 by a large distance in the front-back direction and the left-right direction. Accordingly, friction between the surface S11 of the center pin 26 and the surface S12 of the barrel 22 is reduced. As a result, the life of the coaxial inspection connector 1 can be prolonged.

With the coaxial inspection connector 1, the life of the coaxial inspection connector 1 can be prolonged. To be more specific, moreover, the positions of the surfaces S13 and S14 in the up-down direction overlap the positions of the surfaces S11 and S12 in the up-down direction. Thus, as with the length of the center conductor portion 20, the length of the inner housing 18 is long. Therefore, even if the inclination angle of the inner housing 18 with respect to the up-down direction is small, it is possible to displace the lower end of the outer plunger 12 by a large distance in the front-back direction and the left-right direction. Thus, friction between the surface S13 of the outer housing 36 and the surface S14 of the inner housing 18 is reduced. As a result, the life of the coaxial inspection connector 1 can be prolonged.

With the coaxial inspection connector 1, the inner housing 18 and the center conductor portion 20 can smoothly swing. To be more specific, the positions of surfaces S13 and S14 in the up-down direction overlap the positions of the surfaces S11 and S12 in the up-down direction. Thus, the swing center of the inner housing 18 is located near the swing center of the center conductor portion 20. As a result, the inner housing 18 and the center conductor portion 20 can smoothly swing.

With the coaxial inspection connector 1, variation in characteristic impedance can be suppressed. To be more specific, the characteristic impedance of the coaxial inspection connector 1 depends on the capacitance between the inner housing 18, and the pin 21 and the barrel 22. That is, the characteristic impedance of the coaxial inspection connector 1 depends on the distance between the inner housing 18, and the pin 21 and the barrel 22. Thus, preferably, the distance between the inner housing 18, and the pin 21 and the barrel 22 does not vary by a large distance.

However, the pin 21 is thinner than the barrel 22. Thus, the lower portion 18a and the middle portion 18b surround the pin 21, and the upper portion 18c surround the barrel 22. The lower portion 18a and the middle portion 18b are thinner than the upper portion 18c. Thus, the coaxial inspection connector 1 is designed so that the impedance matches.

With the coaxial inspection connector 1, the center of the lower end of the outer plunger 12 and the center of the cylinder 10 can be made to coincide with each other with high accuracy. To be more specific, positioning of the outer plunger 12 and the cylinder 10 is performed by the surfaces S1 and S2. When the surfaces S1 and S2 are disposed in an upper portion of the cylinder 10, the distance from the surfaces S1 and S2 to the lower end of the outer plunger 12 is long. Therefore, only a small displacement between the surfaces S1 and S2 may lead to a large displacement between the center of the lower end of the outer plunger 12 and the center of the cylinder 10. To suppress this, with the coaxial inspection connector 1, positioning of the outer plunger 12 and the cylinder 10 is performed at a position near the mating receptacle 301. To be more specific, the surface S2 is located at the lower end of the cylinder 10. Thus, the distance from the surfaces S1 and S2 to the lower end of the outer plunger 12 is small, and therefore, even when a small displacement occurs between the surfaces S1 and S2, occurrence of large displacement of the center of the lower end of the outer plunger 12 from the center of the cylinder 10 is suppressed. Thus, the outer plunger 12 can be easily connected to the outer conductor 305 of the mating receptacle 301. However, this does not exclude the possibility that the surface S2 is disposed at a position other than the lower end of the cylinder 10.

With the coaxial inspection connector 1, breakage of the pin 21 is suppressed. To be more specific, when the outer plunger 12 and the pin 21 are not pushed upward, the lower end of the outer plunger 12 is located above the lower end of the pin 21. Thus, when connecting the coaxial inspection connector 1 to the mating receptacle 301, before the pin 21 contacts the mating receptacle 301, the outer plunger 12 contacts the mating receptacle 301. Thus, application of a large force to the pin 21 is suppressed, and breakage of the pin 21 is suppressed.

Other Embodiments

A coaxial inspection connector and a center conductor according to the present disclosure are not limited to the coaxial inspection connector 1, and may be modified within the spirit and scope of the present disclosure.

The surface S1 and the surface S2 need not surface-contact each other. That is, one of the surface S1 or the surface S2 need not be a surface. To be more specific, it is sufficient for the outer plunger 12 to have an annular shape as seen from below and have a contact portion (an example of a first contact portion) that contacts the surface S2. The contact portion may line-contact the surface S2. It is sufficient for the cylinder 10 to have an annular shape as seen from above and have a contact portion (an example of a second contact portion) that contacts the surface S1. The contact portion may line-contact the surface S1.

As described above, the present disclosure is useful for a coaxial inspection connector and, in particular, is advantageous in prolonging the life of a coaxial inspection connector.

What is claimed is:

1. A coaxial inspection connector comprising:
    an outer conductor;
    a center conductor; and
    a first bushing, wherein
    the outer conductor includes
        a first housing that has a tubular shape extending in a first direction, and
        a second housing that has a tubular shape extending from the first housing toward one side in the first direction,
    the center conductor includes
        a first center conductor portion that extends in the first housing in the first direction and that is fixed to the first housing by the first bushing, and
        a second center conductor portion that extends in the second housing in the first direction,
    the second housing is supported by the first housing in such a way that an end portion of the second housing on the one side in the first direction is capable of swinging in a second direction that is perpendicular to the first direction, and
    the second center conductor portion includes
        a swing portion at which the second center conductor portion is supported by the first center conductor portion in such a way that an end portion of the second center conductor portion on the one side in the first direction is capable of swinging in the second direction,
        a tip portion that includes the end portion of the second center conductor portion on the one side in the first direction and that is capable of moving in the first direction relative to the swing portion, and
        an elastic member, the elastic member being included between the swing portion and the tip portion.

2. The coaxial inspection connector according to claim 1, further comprising:
    a second bushing that fixes a positional relationship between the second housing and the second center conductor portion in the second direction.

3. The coaxial inspection connector according to claim 1, wherein
    the outer conductor further includes a cylinder that has a tubular shape extending from the first housing in the first direction,
    the cylinder is fixed to the first housing, and
    the second housing extends in the cylinder in the first direction, and is capable of swinging in the cylinder.

4. The coaxial inspection connector according to claim 3, wherein the outer conductor further includes an outer plunger that has a tubular shape extending in the first direction and into which the end portion of the second housing on the one side in the first direction is inserted, and the coaxial inspection connector further comprises an another elastic member that pushes the outer plunger toward the one side in the first direction relative to the second housing, and wherein the outer plunger and the cylinder are configured in such a way that, when the outer plunger contacts the cylinder, the cylinder applies to the outer plunger a force inward in a radial direction of the cylinder.

5. The coaxial inspection connector according to claim 4, wherein the cylinder has a first surface that has a normal vector pointing inward in the radial direction of the cylinder and pointing toward the other side in the first direction and that has an annular shape as seen from the other side in the first direction, and the outer plunger includes a first contact portion that has an annular shape as seen from the one side in the first direction and that contacts the first surface.

6. The coaxial inspection connector according to claim 5, wherein the first surface is located at a lower end of the cylinder.

7. The coaxial inspection connector according to claim 4, wherein the outer plunger has a second surface that has a normal vector pointing outward in the radial direction of the outer plunger and pointing toward the one side in the first direction and that has an annular shape as seen from the one side in the first direction, and the cylinder includes a second contact portion that has an annular shape as seen from the other side in the first direction and that contacts the second surface.

8. The coaxial inspection connector according to claim 7, wherein the second contact portion is located at a lower end of the cylinder.

9. The coaxial inspection connector according to claim 4, wherein when the outer plunger and the center conductor are not pushed toward the other side in the first direction, an end portion of the outer plunger on the one side in the first direction is located further toward the one side in the first direction than an end portion of the center conductor on the one side in the first direction.

10. The coaxial inspection connector according to claim 1, wherein the swing portion is a barrel that has a tubular shape extending in the first direction, the tip portion is a pin extending in the first direction, an end portion of the pin on the one side in the first direction is inserted into the barrel, and the elastic member is disposed in the barrel and pushes the pin toward the one side in the first direction relative to the barrel.

11. The coaxial inspection connector according to claim 2, wherein the outer conductor further includes a cylinder that has a tubular shape extending from the first housing in the first direction, the cylinder is fixed to the first housing, and the second housing extends in the cylinder in the first direction, and is capable of swinging in the cylinder.

12. The coaxial inspection connector according to claim 5, wherein the outer plunger has a second surface that has a normal vector pointing outward in the radial direction of the outer plunger and pointing toward the one side in the first direction and that has an annular shape as seen from the one side in the first direction, and the cylinder includes a second contact portion that has an annular shape as seen from the other side in the first direction and that contacts the second surface.

13. The coaxial inspection connector according to claim 6, wherein the outer plunger has a second surface that has a normal vector pointing outward in the radial direction of the outer plunger and pointing toward the one side in the first direction and that has an annular shape as seen from the one side in the first direction, and the cylinder includes a second contact portion that has an annular shape as seen from the other side in the first direction and that contacts the second surface.

14. The coaxial inspection connector according to claim 5, wherein when the outer plunger and the center conductor are not pushed toward the other side in the first direction, an end portion of the outer plunger on the one side in the first direction is located further toward the one side in the first direction than an end portion of the center conductor on the one side in the first direction.

15. The coaxial inspection connector according to claim 6, wherein when the outer plunger and the center conductor are not pushed toward the other side in the first direction, an end portion of the outer plunger on the one side in the first direction is located further toward the one side in the first direction than an end portion of the center conductor on the one side in the first direction.

16. The coaxial inspection connector according to claim 7, wherein when the outer plunger and the center conductor are not pushed toward the other side in the first direction, an end portion of the outer plunger on the one side in the first direction is located further toward the one side in the first direction than an end portion of the center conductor on the one side in the first direction.

17. The coaxial inspection connector according to claim 8, wherein when the outer plunger and the center conductor are not pushed toward the other side in the first direction, an end portion of the outer plunger on the one side in the first direction is located further toward the one side in the first direction than an end portion of the center conductor on the one side in the first direction.

18. The coaxial inspection connector according to claim 2, wherein the swing portion is a barrel that has a tubular shape extending in the first direction, the tip portion is a pin extending in the first direction, an end portion of the pin on the one side in the first direction is inserted into the barrel, and the elastic member is disposed in the barrel and pushes the pin toward the one side in the first direction relative to the barrel.

19. The coaxial inspection connector according to claim 3, wherein the swing portion is a barrel that has a tubular shape extending in the first direction, the tip portion is a pin extending in the first direction, an end portion of the pin on the one side in the first direction is inserted into the barrel, and the elastic member is disposed in the barrel and pushes the pin toward the one side in the first direction relative to the barrel.

20. The coaxial inspection connector according to claim 4, wherein the swing portion is a barrel that has a tubular shape extending in the first direction, the tip portion is a pin extending in the first direction, an end portion of the pin on the one side in the first direction is inserted into the barrel, and the elastic member is disposed in the barrel and pushes the pin toward the one side in the first direction relative to the barrel.

\* \* \* \* \*